United States Patent [19]

Nakamura

[11] Patent Number: 4,785,203
[45] Date of Patent: Nov. 15, 1988

[54] BUFFER CIRCUIT HAVING DECREASED CURRENT CONSUMPTION

[75] Inventor: Kenichi Nakamura, Tokyo, Japan

[73] Assignee: Kabushiki Kaisha Toshiba, Tokyo, Japan

[21] Appl. No.: 28,669

[22] Filed: Mar. 20, 1987

Related U.S. Application Data

[63] Continuation-in-part of Ser. No. 23,577, Mar. 9, 1987, abandoned.

[30] Foreign Application Priority Data

Mar. 20, 1986 [JP] Japan .................................. 61-63214

[51] Int. Cl.$^4$ ................. H03K 19/017; H03K 19/094; H01L 11/16; G06G 7/10
[52] U.S. Cl. .................................... 307/448; 307/443; 307/451; 307/491; 307/542; 307/572
[58] Field of Search .................... 307/200 B, 443, 448, 307/451, 491, 542, 557, 572

[56] References Cited

U.S. PATENT DOCUMENTS

| 4,103,188 | 7/1978 | Morton | 307/251 |
| 4,305,009 | 12/1981 | Miyagawa et al. | 307/264 |
| 4,477,741 | 10/1984 | Moser, Jr. | 307/473 |
| 4,518,873 | 5/1985 | Suzuki et al. | 307/451 |
| 4,567,378 | 1/1986 | Raver | 307/270 |
| 4,587,445 | 5/1986 | Kanuma | 307/443 |
| 4,622,482 | 11/1986 | Ganger | 307/585 |
| 4,638,187 | 1/1987 | Boles et al. | 307/443 |
| 4,682,055 | 7/1987 | Upadhyalula | 307/451 |

FOREIGN PATENT DOCUMENTS

| 59-20027 | 2/1984 | Japan . | |
| 0066520 | 4/1985 | Japan | 307/448 |
| 0136420 | 7/1985 | Japan | 307/451 |

Primary Examiner—John S. Heyman
Assistant Examiner—Margaret Rose Wambach
Attorney, Agent, or Firm—Finnegan, Henderson, Farabow, Garrett & Dunner

[57] ABSTRACT

This invention provides a buffer circuit for a semiconductor integrated circuit having a power source voltage, an input node receiving for an input current from the integrated circuit, and an output node for outputting an output current responsive to the input current. The circuit comprises a load transistor circuit having first and second states, for increasing the input current of the buffer circuit from a first predetermined voltage when the load transistor circuit is in one of the first and second states; a drive transistor circuit having first and second corresponding states, for increasing the input current of the buffer circuit from a second predetermined voltage when the load transistor circuit is in a state opposite to the one state; and a circuit for reducing the rate of increase in the input current of the buffer circuit for stabilizing the power source voltage.

17 Claims, 11 Drawing Sheets

BUFFER CIRCUIT HAVING DECREASED CURRENT CONSUMPTION

This is a continuation-in-part of U.S. patent application Ser. No. 07/023,577 filed on Mar. 9, 1987, now abandoned.

BACKGROUND OF THE INVENTION

1. Field of the Invention

This invention relates to a buffer circuit. In particular, it relates to an output buffer circuit for a semiconductor integrated circuit.

2. Description of the Related Art

Figure 1:
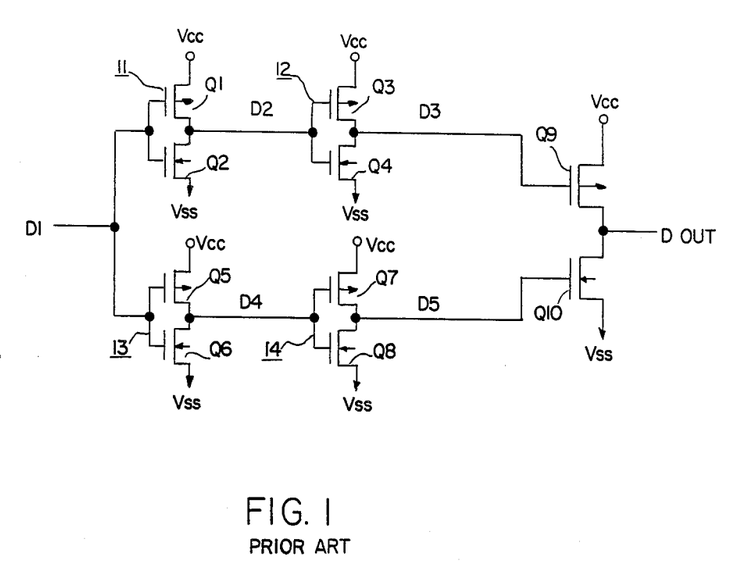
FIG. 1 is a circuit diagram of a conventional buffer circuit.

A conventional output circuit of a semiconductor integrated circuit device is constructed for example as shown in FIG. 1. In FIG. 1, reference numerals 11 to 14 represent CMOS inverters, constructed of P-channel MOS transistors Q1, Q3, Q5 and Q7 and N-channel MOS transistors Q2, Q4, Q6 and Q8. A signal D1 from the internal circuitry (not shown) is fed to the gate of P-channel load MOS transistor Q9 through inverters 11 and 12 and to the gate of N-channel drive MOS transistor Q10 through inverters 13 and 14. These MOS transistors Q9 and Q10 are series-connected between power source Vcc and ground Vss. Output signal Dout is obtained from the point of connection of these transistors Q9 and Q10. Inverters 11 and 13 are arranged to prevent both MOS transistors Q9 and Q10 from being ON at the same time which would allow a DC through-current to pass from power source Vcc to ground Vss. The change of output from high ("H") level to low ("L") level for inverter 11 takes place slightly before that of inverter 13, while the change of output from low ("L") level to high ("H") level for inverter 11 takes place slightly after that of inverter 13. This can be achieved for example by setting the dimension of MOS transistor Q1 to be smaller than that of MOS transistor Q2, and by setting the dimension (gate length and/or width) of MOS transistor Q5 to be larger than that of MOS transistor Q6. This makes the threshold value of inverter 11 lower than that of inverters 12 and 14, and the threshold value of inverter 13 higher than that of inverters 12 and 14.

Figure 2A:
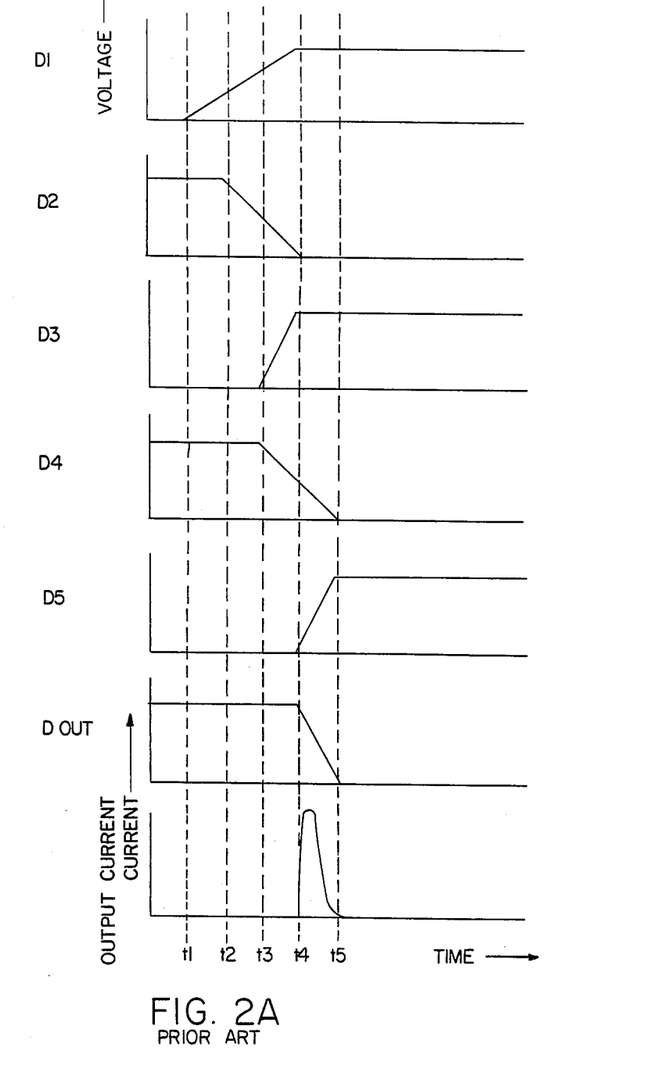
FIGS. 2a and b are a diagram given in explanation of the operation of the circuit of FIG. 1.

The operation of the above circuit will now be described with reference to FIGS. 2(a) and (b). FIG. 2(a) shows the waveforms of the various signals when signal D1 from the internal circuitry changes from "L" to "H" level, and FIG. 2(b) shows the waveforms of the various signals when signal D1 changes from "H" to "L" level.

As shown in FIG. 2(a), at time-point t1, signal D1 from the internal circuitry rises from "L" level to "H" level. Thereupon, at time t2, output D2 of inverter 11 starts to change from "H" level to "L" level, and at time t3 output D4 of inverter 13 also starts to change from "H" level to "L" level. At the time-point t3 when output D2 of inverter 11 becomes lower than the circuit threshold value of inverter 12, output D3 of inverter 12 rises from "L" level to "H" level. This turns load MOS transistor Q9 OFF. On the other hand, at the time-point t4 when output D4 of inverter 13 becomes lower than the circuit threshold value of inverter 14, output D5 of inverter 14 rises from "L" level to "H" level. Consequently, drive MOS transistor Q10 turns ON, and output signal Dout falls from "H" level to "L" level at time-point t4. As shown in the Figure, a large peak current flows between the time points t4 and t5, which output signal Dout is being inverted.

Figure 2B:
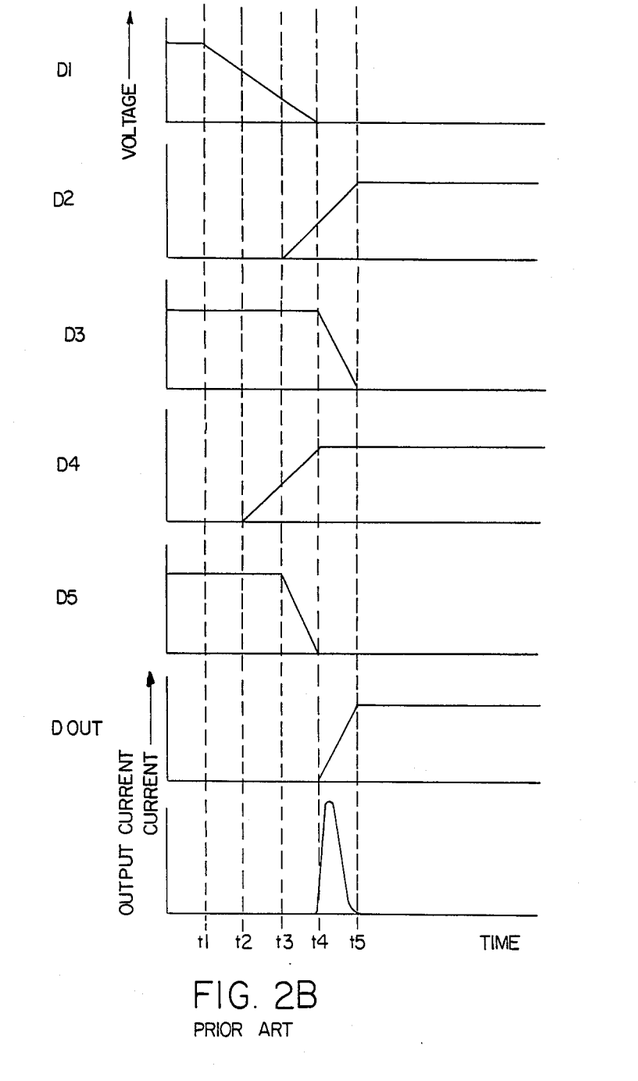

In contrast, as shown in FIG. 2(b), signal D1 from the internal circuitry begins to fall at time t1 from "H" level to "L" level. At time t2, output D4 of inverter 13 starts to change from "L" level to "H" level, and at time t3 output D2 of inverter 11 also starts to change from "L" level to "H" level. At the time-point t3, when output D4 of inverter 13 has become higher than the circuit threshold value of inverter 14, output D5 of inverter 14 begins to fall from "H" level to "L" level. This turns drive MOS transistor Q10 OFF. Also, at the time-point t4 when output D2 of inverter 11 has become higher than the circuit threshold value of inverter 12, output D3 of inverter 12 begins fall from "H" level to "L" level. Consequently, load MOS transistor Q9 turns ON, and output signal Dout rises from "L" level to "H" level beginning at time-point t4. As shown in the Figure, a large peak current flows between the time-points t4 and t5 during which time output signal Dout is inverted. In general, however, in order to satisfy the specification for $I_{OH}$ (high level output current)/$I_{OL}$ (low level output current), the final-stage transistor in an output buffer circuit normally must be designed so as to permit a large current to flow. Specifically, in the FIG. 1 circuit described above, drive MOS transistor Q10 is designed so as to permit a large current flow in order to satisfy the $I_{OL}$ specification. Consequently, when drive MOS transistor Q10 changes from the OFF state to the ON state, a large current flows, i.e. there is an abrupt increase in current consumption. This generates self-noise, which is a cause of spurious circuit operation. Likewise, load MOS transistor Q9 is designed so as to permit alarge current to flow in order to satisfy the $I_{OH}$ specification. Consequently, when load MOS transistor Q9 changes from the OFF state to the ON state, a large current flows, i.e. there is an abrupt increase in current consumption. This also generates self-noise, which is a cause of spurious circuit operation.

As explained above, the output buffer circuit of FIG. 1 has a drawback, since it is designed for a large current flow in order to satisfy the specification for $I_{OH}$ (high level output current)$I_{OL}$ (low level output current). This results in an abrupt increase of current consumption on inversion of the output, generating self-noise which is a cause of spurious circuit operation.

SUMMARY OF THE INVENTION

The object of this invention is to remove this drawback and provide a buffer circuit wherein an abrupt increase in current consumption can restrained and so generation of self-noise, causing spurious circuit operation, can be prevented.

This invention provides a buffer circuit for a semiconductor integrated circuit having a power source voltage, an input node for receiving an input current from the integrated circuit, and an output node for outputting an output current responsive to the input current, comprising: load transistor means having first and second states, for increasing the input current of the buffer circuit from a first predetermined voltage when the load transistor means is in one of the first and second states; drive transistor means having first and second corresponding states, for increasing the input current of the buffer circuit from a second predetermined voltage when the load transistor means is in a state opposite to the one state; and means for reducing the rate of increase in the input current of the buffer circuit for stabilizing the power source voltage.

With a construction as above, at the times when the output signal is inverted, the plurality of load MOS transistors go conducting successively, to set the output node to "H," and the plurality of drive MOS transistors go conducting successively, to set the output node to "L." Thus there is no abrupt increase of the current when inversion takes place. And since the nonconducting signals are not delayed, there is no risk of through-current through load MOS transistors and drive MOS transistors. So there is no need to decrease the speed as a countermeasure against through-current, as there is in the conventional circuit.

DETAILED DESCRIPTION OF THE PREFERRED EMBODIMENTS

Figure 3:
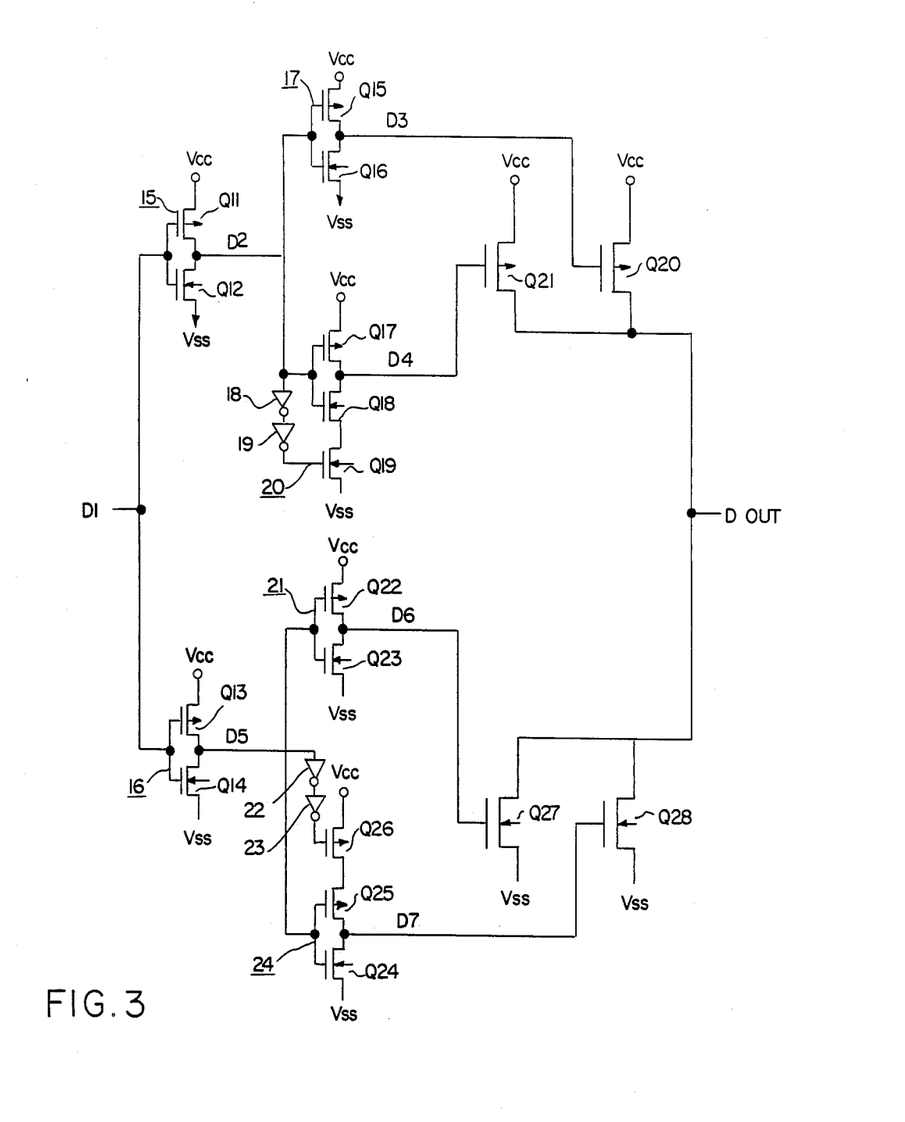
FIG. 3 is a circuit diagram of a buffer circuit according to an embodiment of this invention.

An embodiment of the invention is described below with reference to the drawings. As shown in FIG. 3, signal D1 supplied from the internal circuitry is fed to a CMOS inverter 15 consisting of a P channel MOS transistor Q11 and an N channel MOS transistor Q12, and to a CMOS inverter 16 consisting of a P channel MOS transistor Q13 and an N channel MOS transistor Q14. The output D2 of this inverter 15 is fed to a CMOS inverter 17 consisting of a P channel MOS transistor Q15 and an N channel MOS transistor Q16. This output D2 is also supplied to the gate of a P channel MOS transistor Q17, one end of which is connected to power source Vcc, and to the gate of an N channel MOS transistor Q18, one end of which is connected to the other end of this MOS transistor Q17. The output of this inverter 15 is fed through delay elements such as inverters 18 and 19 to the gate of an N channel MOS transistor Q19 that is connected between the other end of this MOS transistor Q18 and ground node Vss. These MOS transistors Q17, Q18 and Q19 act as delay means such as an inverter 20 that has a delay action only when the output level is "L." The output of inverter 17 is supplied to the gate of a P channel load MOS transistor Q20, one end of which is connected to power source Vcc. The output of inverter 20 is delivered from the point of connection of these MOS transistors Q17 and Q18, and supplied to the gate of P-channel load MOS transistor Q21. One end of transistor Q21 is connected to power source Vcc. The other ends of MOS transistors Q20 and Q21 are connected in common.

The output of inverter 16 is fed to a CMOS inverter 21 consisting of a P channel MOS transistor Q22 and an N channel MOS transistor Q23. This output also is supplied to the gate of an N channel MOS transistor Q24, one end of which is connected to ground node Vss. The output also is supplied to the gate of a P channel MOS transistor Q25, one end of which is connected to the other end of this MOS transistor Q24. The output of inverter 16 also is fed through delay elements such as inverters 22 and 23 to the gate of a P channel MOS transistor Q26 that is connected between the other end of this MOS transistor Q25 and power source Vcc. These MOS transistors Q24, Q25 and Q26 act as delay means such as an inverter 24 that has a delay action only when the output level is "H." The output of inverter 21 is supplied to the gate of an N channel drive MOS transistor Q27 that is connected between the common connection point of the other ends of MOS transistors Q20 and Q21 and ground node Vss. The output of inverter 24 that is delivered from the point of connection of these MOS transistors Q24 and Q25 is supplied to the gate of an N channel drive MOS transistor Q28. Transistor Q28 is connected between the point of common connection of the other ends of MOS transistors Q20 and Q21 and ground node Vss.

Figure 4A:
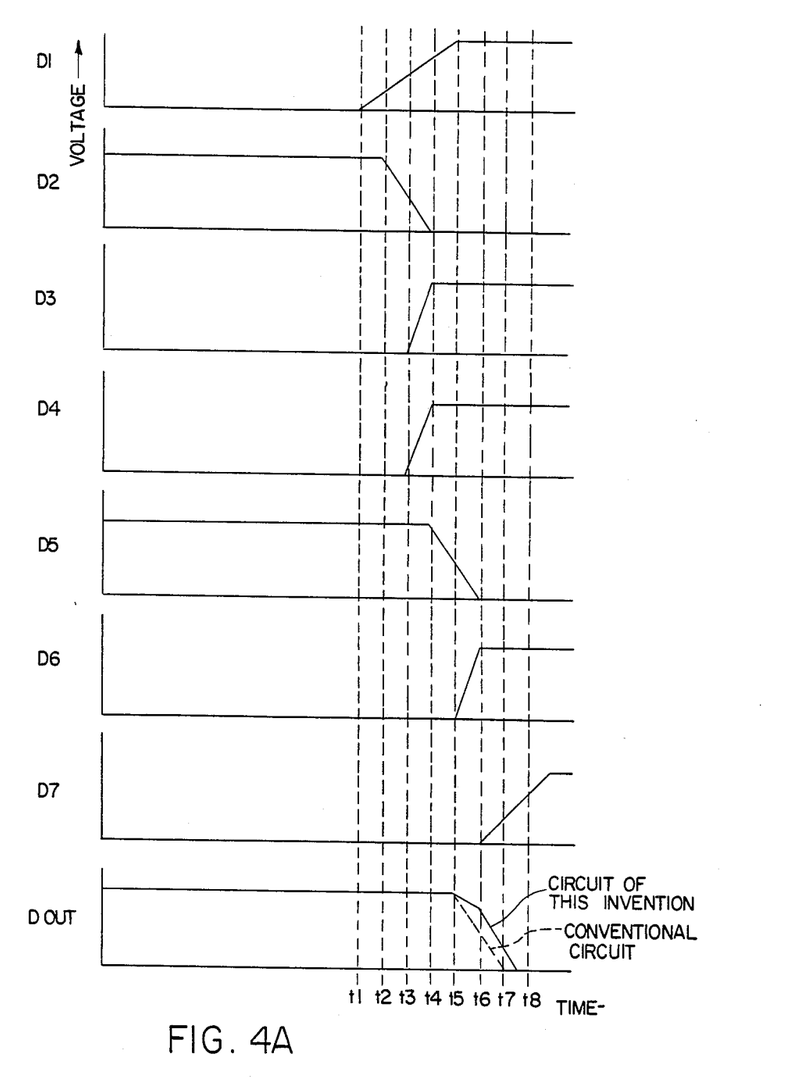
FIGS. 4a and b and FIGS. 5a and b are diagrams given in explanation of the operation of the circuit of FIG. 3.
Figure 4B:
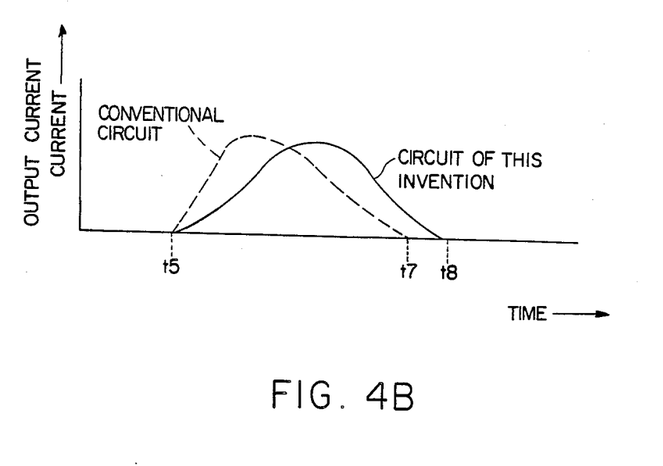
Figure 5A:
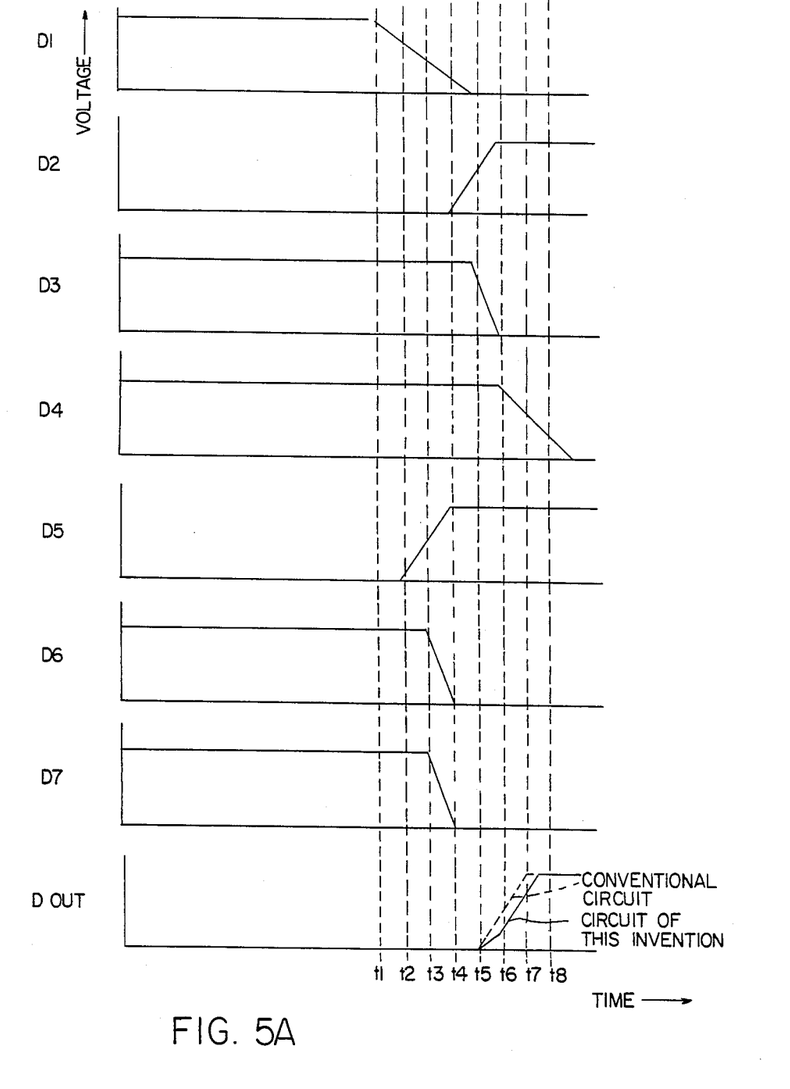
Figure 5B:
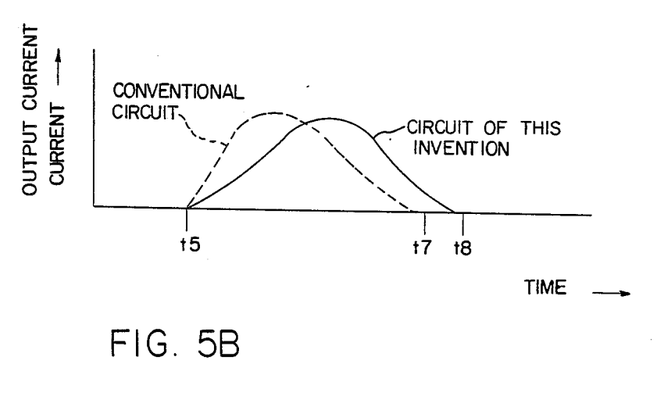

The operation of the above circuit will now be described with reference to FIGS. 4(a) and (b) and FIGS. 5(a) and (b). FIG. 4(a) shows the waveforms of the various signals when signal D1 from the internal circuitry changes from "L" level to "H" level. FIG. 4(b) shows a comparison of the output current waveforms that are then obtained with the conventional circuit and with the circuit of this invention. FIG. 5(a) shows the waveforms of the various signals when siqnal D1 from the internal circuitry changes from "H" level to "L" level. FIG. 5(b) shows a comparison of the output current waveforms that are then obtained with the conventional circuit and with the circuit of this invention.

As shown in FIG. 4(a), at time-point t1 signal D1 from the internal circuitry rises from "L" level to "H" level. Thereupon, at time t2, output D2 of inverter 15 starts to change from "H" level to "L" level, and, at time t3, when the output D2 of inverter 15 falls below the circuit threshold value of inverters 17 and 18, outputs D3 and D4 of these circuits start to change from "L" level to "H" level. This turns both load MOS transistors Q20 and Q21 OFF simultaneously. Next, at time-point t4, output D5 of inverter 16 starts to change from "H" level to "L" level. At the time-point t5 when this output D5 of inverter 16 gets lower than the circuit threshold value of inverters 21 and 24, their outputs D6 and D7 start to change from "L" level to "H" level. In this process, since signal D5 that is supplied to MOS transistor Q26 of inverter 24 is delayed by inverters 22 and 23, the output of this inverter 24 rises to the "H" level slowly. Consequently, first of all, drive MOS transistor Q27 is turned ON when D6 rises (at time-point t5) by the output of inverter 21, and drive MOS transistor Q28 is turned ON when D7 rises at time-point t6. D6 switches to "H" level by means of Vcc through transistor Q22. However, D7 rises more slowly to "H" level because it is charged by Vcc through two transistors Q25 and Q26. Consequently at time-point t5 output signal Dout starts to fall slowly from "H" level to "L," becoming "L" level after a prescribed time has lapsed since time-point t7. The total current sinking capacity of Q27 and Q28 is equal to the current sinking capacity of transistor Q10 in FIG. 1. Thus, the current between time-points t5 and t8 at which this output signal Dout is inverted follows a gentle gradient as shown in FIG. 4(b), with no abrupt increase in current.

As shown in FIG. 5(a), at time-point t1 signal D1 from the internal circuitry falls from "H" level to "L" level. Thereupon, at time t2, output D5 of inverter 16 starts to change from "L" level to "H" level, and, at time t3, when the output D5 of inverter 16 gets lower than the circuit threshold value of inverters 21 and 24, outputs D6 and D7 of these circuits start to change from "H" level to "L" level. This turns both drive MOS transistors Q27 and Q28 OFF simultaneously. Next, at time-point t4, output D2 of inverter 15 starts to change from "L" level to "H" level. When this output D2 of inverter 15 falls below the circuit threshold values of inverters 17 and 20, their outputs D3 and D4 start to change from "H" level to "L" level. D3 starts to fall at time-point t5 and D4 at time-point t6. In this process, since signal D2 that is supplied to MOS transistor Q19 of inverter 20 is delayed by inverters 18 and 19, the output of this inverter 20 falls to "L" level slowly. Consequently, first of all, load MOS transistor Q20 is turned ON (at time-point t5) by the output of inverter 17, and load MOS transistor Q21 is turned ON at time-point t7. Consequently at time-point t5 output signal Dout starts to rise slowly from "L" level to "H," becoming "H" level at time-point t8. Thus, the current between time-points t5 and t8 at which this output signal Dout is inverted follows a gentle gradient, as shown in FIG. 5(b), with no abrupt increase in current.

By means of this construction, when output signal Dout is inverted, load MOS transistors Q20 and Q21 are turned ON sequentially with a prescribed time interval, and drive MOS transistors Q27 and Q28 are turned ON sequentially with a prescribed time interval. This prevents abrupt rise in the current consumption, and avoids the generation of self-noise which is a cause of spurious circuit operation. The noise margin of the semiconductor integrated circuit device can therefore be increased. Furthermore, since load MOS transistors Q20 and Q21 or drive MOS transistors Q27 and Q28 change simultaneously from the ON state to the OFF state, there can be no great loss of speed of operation. Also, since there is no possibility of load MOS transistors Q20 and Q21 and drive MOS transistors Q27 and Q28 going simultaneously ON, there is no possibility of D.C. through-current.

Figure 6:
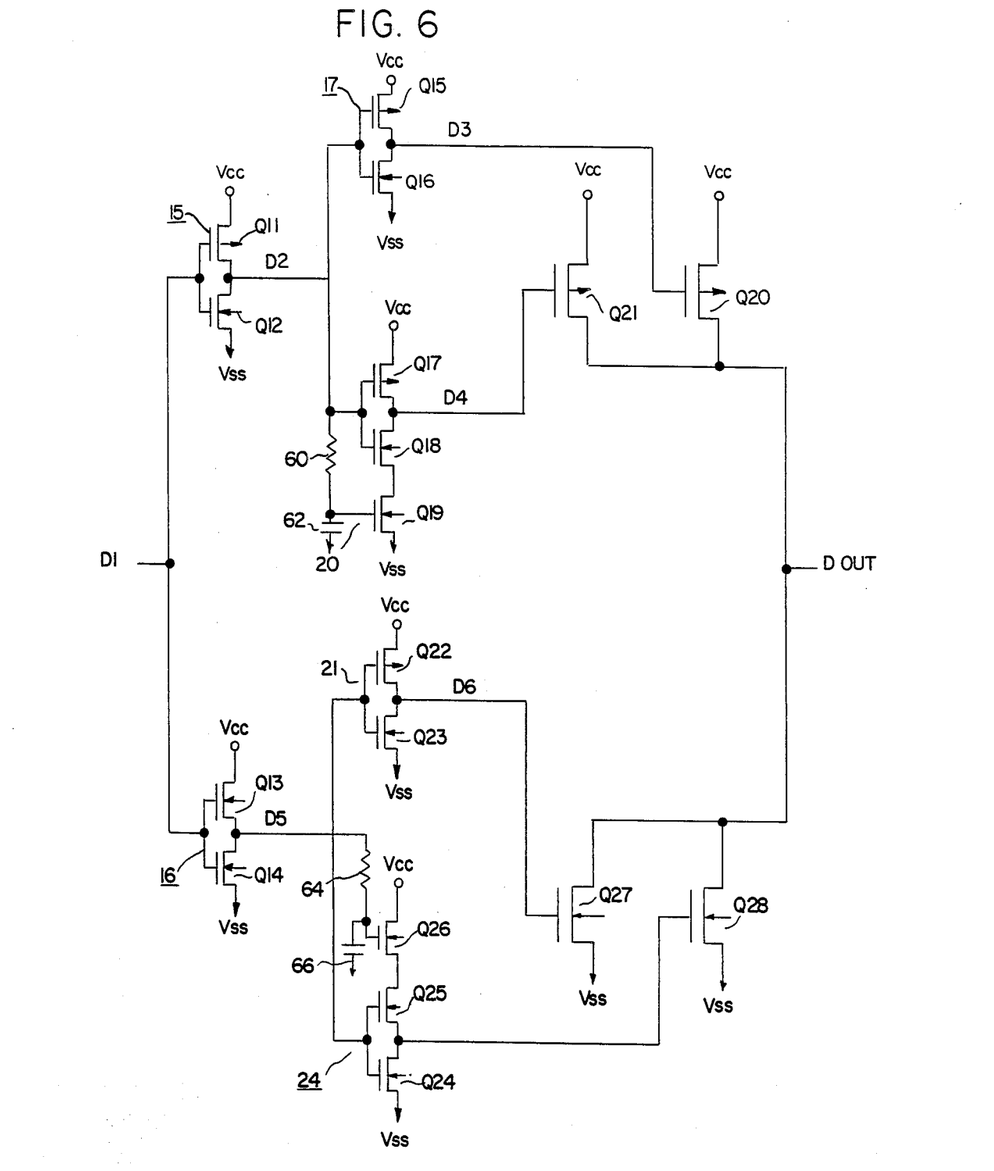
FIG. 6 to FIG. 8 are circuit diagrams of a buffer circuit according to other embodiments of this invention.

FIG. 6 is a circuit diagram of a buffer circuit according another embodiment of this invention. As shown in FIG. 6, it differs from the embodiment described above with reference to FIG. 3 in that a delay element is constituted by resistors 60 and 64 and capacitors 62 and 66. The same symbols as appears in FIG. 3 are used for the other components shown in FIG. 6.

Figure 7:
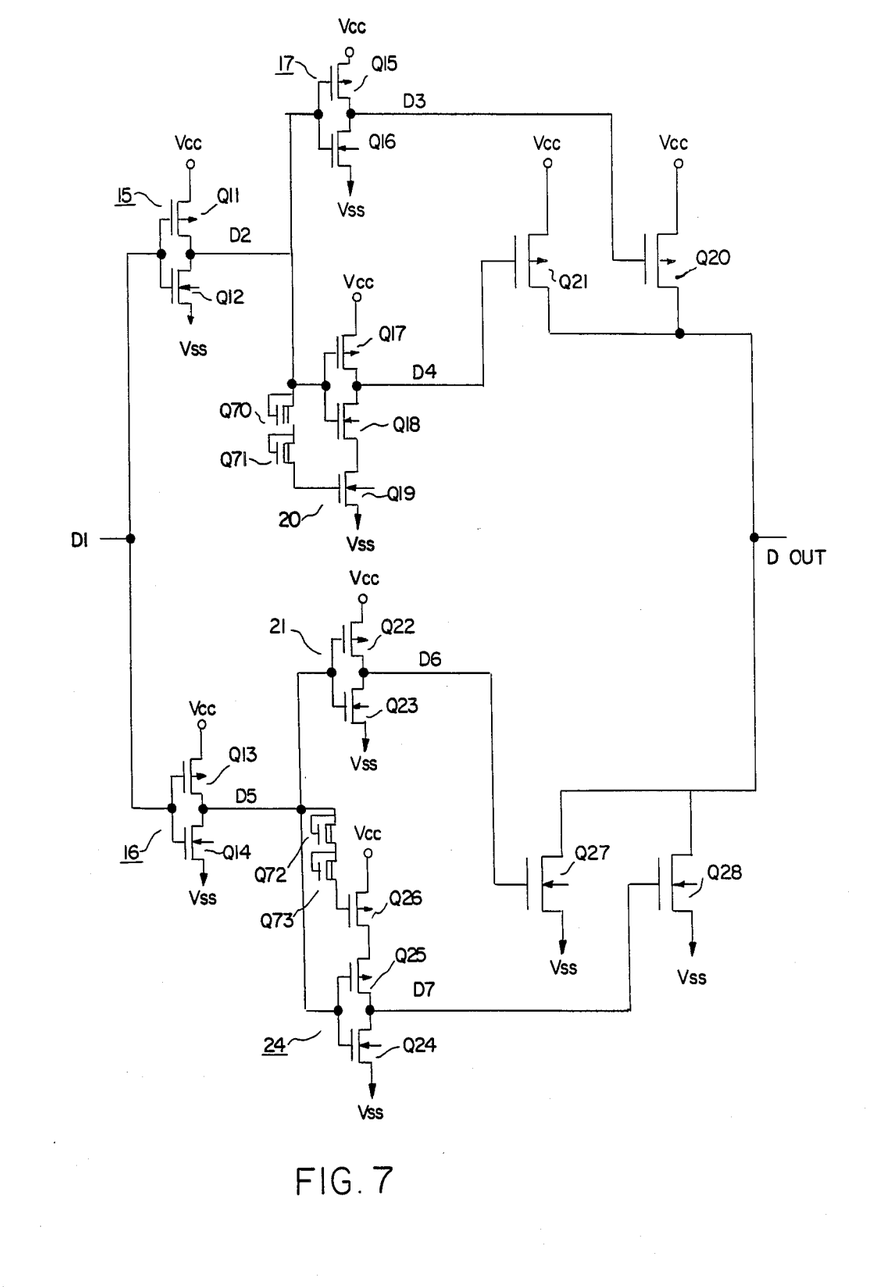

FIG. 7 is a circuit diagram of a buffer circuit according to another embodiment of this invention. As shown in FIG. 7, it differs from the embodiment described above with reference to FIG. 3 in that a delay element is constituted by a depletion type MOS transistors Q70 to Q73 whose gate and source are connected to each other. The same symbols as appears in FIG. 3 are used for the other components shown in FIG. 7.

Figure 8:
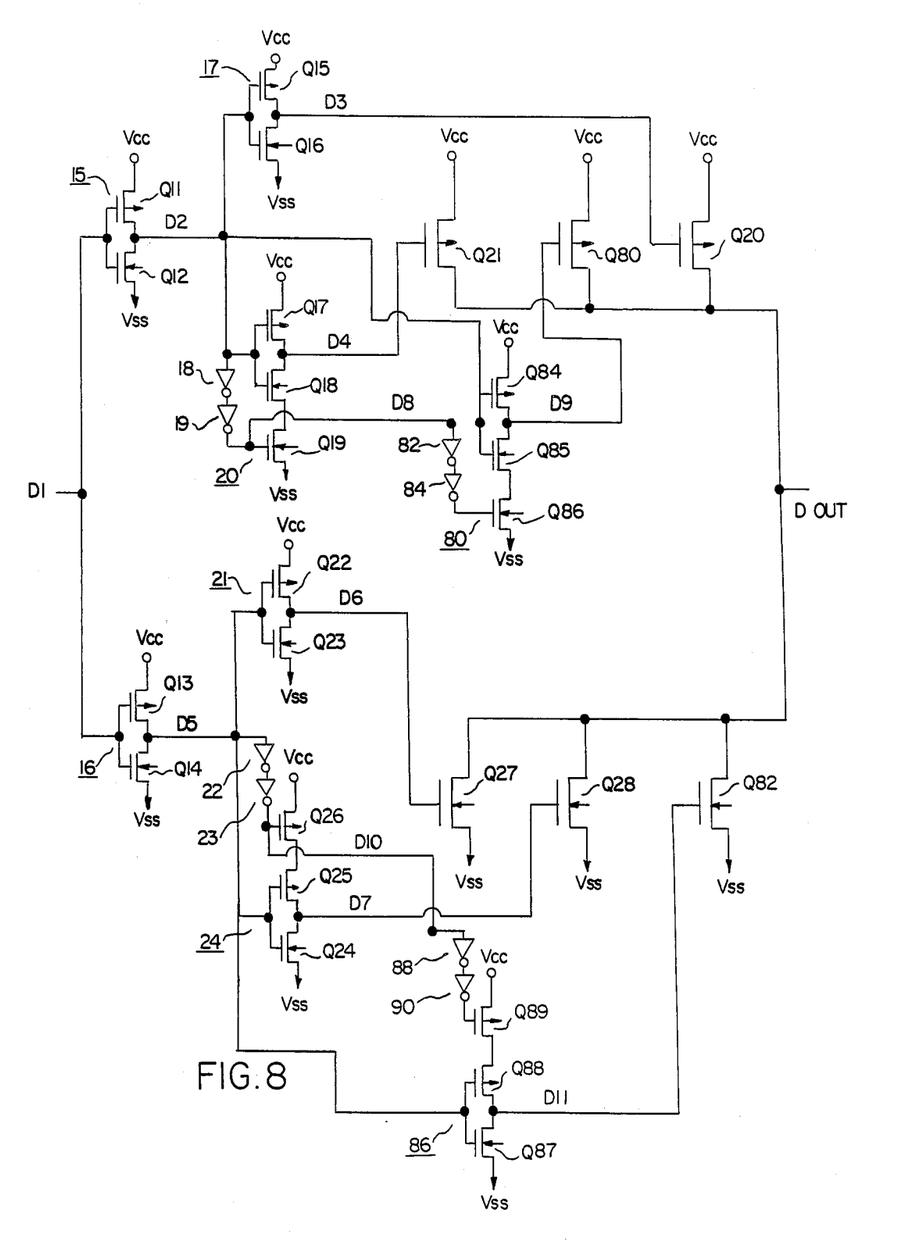

Although the case described in the above embodiment is one in which two load MOS transistors and drive transistors are used, a plural number greater than this could of course be used. FIG. 8 is a circuit diagram of a buffer circuit according another embodiment of this invention. This circuit is constituted by three load MOS transistors and three drive transistors. As shown in FIG. 8, it differs from the embodiment described above with reference to FIG. 3 in that a delay means such as inverters 80 and 86, a load transistor Q80, and a drive transistor Q82 are added to the buffer circuit shown in FIG. 3. The same symbols as appears in FIG. 3 are used for the other components shown in FIG. 8.

An output D8 of inverters 18 and 19 is supplied to the delay means such as inverter 80. The construction of this inverter 80 is same as that of inverter 20. MOS transistors Q84, Q85 and Q86 act as the inverter that has a delay action only when the output Dout level is "L." The output of inverter 80 is delivered from the point of connection of these MOS transistors Q84 and Q85, and supplied to the gate of P-channel load MOS transistor Q80. One end of transistor Q80 is connected to power source Vcc. The other end of MOS transistors Q20, Q21 and Q80 are connected in common.

An output D10 of inverters 22 and 23 is supplied to the delay means such as an inverter 86. The construction of this inverter 86 is the same as that of inverter 24. MOS transistors Q87, Q88 and Q89 act as the inverter that has a delay action only when the output Dout level is "H." The output of inverter 86 is delivered from the point of connection of these MOS transistors Q87 and Q88, and supplied to the gate of N-channel drive MOS transistor Q82. One end of transistor Q82 is connected to power source Vss. The other end of MOS transistors Q27, Q28 and Q82 are connected in common.

Output signal Dout shown in FIG. 8 follows a gentler gradient compared with the embodiment of FIG. 3 with no abrupt increase in current.

As described above, with this invention, a buffer circuit can be obtained wherein abrupt increase in current consumption is avoided and the generation of self-noise, which is a cause of spurious circuit operation, is thereby prevented.

Various modifications and variations could be made to the invention without departing from the scope or spirit of the invention.

What is claimed is:

1. A buffer circuit for a semiconductor integrated circuit having first and second nodes (Vcc, Vss) which are supplied with first and second voltages respectively, an input node (D1) for receiving an input current from the integrated circuit, and an output node ($D_{out}$) for outputting an output current responsive to the input current, said buffer circuit comprising:

load transistor means (Q20, Q21, Q80) including a plurality of load transistors coupled in parallel between said output node and said first node, and having first and second states, for increasing the input current of the buffer circuit when said load transistor means is in one of said first and second states;

drive transistors means (Q27, Q28, Q82) including a plurality of drive transistors coupled in parallel between said output node and said second node, and having first and second corresponding states, for increasing the input current of the buffer circuit when said load transistor means is in the same state as said load transistor means; and first switching means (17, 20) for sequentially switching said plurality of load transistors from the first state to the second state at predetermined delay times and from the second state to the first state simultaneously;

second switching means (21, 24) for sequentially switching said plurality of drive transistors from the first state to the second state at predetermined delay times and from the second state to the first state simultaneously.

2. The device of claim 1 wherein the load transistor means includes first and second load transistors, and wherein the first switching means includes first and second delay means responsive to the input current for sequentially switching the load transistors from the first state to the second state at predetermined delay times, and switching the load transistors from the second state to the first state simultaneously;

and wherein the drive transistor means includes first and second drive transistors, and wherein the second switching means includes third and fourth delay means responsive to the input current for sequentially switching the drive transistors from the first state to the second state at predetermined delay times, and switching the drive transistors from the second state to the first state simultaneously.

3. The device of claim 2, further comprising:
a first inverter means (15) having a first predetermined threshold voltage for inverting the input current and supplying the inverted current to the first switching means; and
a second inverter means (16) having a second predetermined threshold voltage for inverting the input current and supplying the inverted current to the second switching means.

4. The device of claim 3 wherein the first inverter means includes a first P-channel transistor (Q11) and a first N-channel transistor (Q12), the two transistors being coupled in series between the first and second nodes, and wherein the second inverter means includes a second P-channel transistor (Q13) and a second N-channel transistor (Q14), the two transistors being coupled in series between the first and second nodes.

5. The device of claim 4 wherein each transistor has a predetermined gate length, the gate length of the first P-channel transistor (Q11) being smaller than that of the first N-channel transistor (Q12) and the gate length of the second P-channel transistor (Q13) being larger than that of the second N-channel transistor (Q14).

6. The device of claim 2 wherein the first delay means includes third inverter means (17) for switching one of the load transistors in response to the input current and wherein said second delay means includes fourth inverter means (20) for switching another of the load transistors at predetermined delay times in response to the input current.

7. The device of claim 2 wherein the second delay means includes fifth inverter means (21) for switching one of the drive transistors in response to the input current and sixth inverter means (24) for switching another of the drive transistors at predetermined delay times in response to the input current.

8. The device of claim 6 wherein the fourth inverter means (20) includes a third P-channel (Q17) transistor, third (Q18) and fourth (Q19) N-channel transistors, and a first delay element (18, 19), each transistor having a corresponding input junction, the transistors being coupled in series between the first and second nodes, the first delay element (18, 19) being coupled between the input junction of the fourth N-channel transistor (Q19) and the third N-channel transistor (Q18).

9. The device of claim 8 wherein the first delay element (18, 19) has a corresponding first output signal, and wherein the first delay means also includes seventh inverter means (80) for switching another of the load transistors at predetermined delay times in response to the first output signal of the first delay element (18, 19).

10. The device of claim 7 wherein the sixth inverter means (24) includes a fifth N-channel transistor (Q24), fourth and fifth P-channel transistors (Q25, Q26), and a second delay element (22, 23), each transistor having a corresponding input junction, the transistors being coupled in series between the first and second nodes, the second delay element being coupled between the input junctions of the fifth P-channel transistors (Q26) and the fifth N-channel transistor (Q25).

11. The device of claim 10 wherein the second delay element (22, 23) has a corresponding second output signal, and the second delay means also includes eighth inverter means (86) for switching another of the load transistors at predetermined delay times in response to the second output signal of the second delay element (22, 23).

12. The device of claim 8 wherein the first delay element includes an inverter.

13. The device of claim 8 wherein the first delay element includes a resistor and a capacitor.

14. The device of claim 8 wherein the first delay element includes a depletion type MOS transistor, the gate and drain thereof being coupled together.

15. The device of claim 10 wherein the second delay element includes an inverter.

16. The device of claim 10 wherein the second delay element includes a resistor and a capacitor.

17. The device of claim 10 wherein the second delay element includes a depletion type MOS transistor, the gate and drain thereof being coupled together.

* * * * *